(12) United States Patent
Molnar et al.

(10) Patent No.: US 9,184,321 B2
(45) Date of Patent: Nov. 10, 2015

(54) CONCENTRATING SOLAR MIRROR PANEL ASSEMBLY WITH CORRUGATED STIFFENER

(75) Inventors: Attila Molnar, Vadnais Heights, MN (US); Duane M. Hart, Rosemount, MN (US); Dylan T. Cosgrove, Oakdale, MN (US); Scott E. Simons, Forest Lake, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 162 days.

(21) Appl. No.: 13/393,879

(22) PCT Filed: Sep. 1, 2010

(86) PCT No.: PCT/US2010/047431
§ 371 (c)(1),
(2), (4) Date: Mar. 2, 2012

(87) PCT Pub. No.: WO2011/028742
PCT Pub. Date: Mar. 10, 2011

(65) Prior Publication Data
US 2012/0160324 A1    Jun. 28, 2012

Related U.S. Application Data

(60) Provisional application No. 61/239,265, filed on Sep. 2, 2009.

(51) Int. Cl.
*H01L 31/0232* (2014.01)
*H01L 31/052* (2014.01)
(Continued)

(52) U.S. Cl.
CPC ............ *H01L 31/0232* (2013.01); *G02B 5/10* (2013.01); *F24J 2/04* (2013.01); *G06F 17/50* (2013.01); *H01L 31/0543* (2014.12); *H01L 31/0547* (2014.02); *Y02E 10/52* (2013.01)

(58) Field of Classification Search
CPC ............ H01L 31/0522; H01L 31/0482; H01L 31/0422; H01L 31/042; H01L 31/058; H01L 31/022425; H01L 31/045; H01L 31/301; H01L 31/02167; H01L 31/02008; H01L 31/5338; H01L 31/02021; H01L 31/0232; H01L 31/0547; H01L 31/0543; H01L 31/052; H01L 31/0521; H01L 31/18; Y02E 10/52; Y02E 10/50; Y02E 10/47; B32B 7/04; F24J 2/04; G02B 5/10; G06F 17/50
USPC .................. 136/259, 243, 244, 245, 246, 252
See application file for complete search history.

(56) References Cited

U.S. PATENT DOCUMENTS 2,949,667 A    8/1960 Cameron
3,076,390 A *  2/1963 Custer ............................. 404/35
(Continued)

FOREIGN PATENT DOCUMENTS

CA    1292641     12/1991
CN    2705524      6/2005
(Continued)

OTHER PUBLICATIONS http://www.vocabulary.com/dictionary/joined retrieved Feb. 25, 2014.*

(Continued)

*Primary Examiner* — Jayne Mershon
*Assistant Examiner* — Mayla Gonzalez Ramos
(74) *Attorney, Agent, or Firm* — Kathleen B. Gross

(57) ABSTRACT

A concentrating solar mirror panel assembly having a reflective sheet with a reflective major surface and an opposing major surface and a corrugated stiffener having ridges and troughs each having an outer surface with land areas, wherein the land areas of at least a portion of the ridges are joined to at least a portion of the opposing major surface of the reflective sheet. The concentrating solar mirror panel assembly is non-planar and substantially rigid. The concentrating solar mirror panel assembly is assembled such that a desired non-planar shape is maintained: either using a locking sheet or having the corrugated stiffener attached so that its principal axes of corrugation are substantially perpendicular to the axis of curvature of the assembly. Methods of making the concentrating solar mirror panel assembly are also disclosed. Concentrated solar power systems and solar collection devices are also disclosed.

13 Claims, 4 Drawing Sheets

(51) Int. Cl.
*H01L 31/18* (2006.01)
*H01L 31/042* (2014.01)
*G02B 5/10* (2006.01)
*H01L 31/054* (2014.01)
*F24J 2/04* (2006.01)
*G06F 17/50* (2006.01)

(56) References Cited

U.S. PATENT DOCUMENTS

| | | | |
|---|---|---|---|
| 4,024,852 A * | 5/1977 | L'Esperance et al. | 126/646 |
| 4,120,565 A | 10/1978 | Rabl | |
| 4,190,037 A | 2/1980 | Niedermeyer | |
| 4,292,956 A | 10/1981 | Wasserman | |
| 4,394,529 A * | 7/1983 | Gounder | 136/245 |
| 4,435,043 A | 3/1984 | Mertens | |
| 4,645,714 A | 2/1987 | Roche | |
| 4,708,757 A | 11/1987 | Guthrie | |
| 5,751,503 A | 5/1998 | Blackmon | |
| 5,956,191 A | 9/1999 | Blackmon | |
| 6,088,163 A | 7/2000 | Gilbert | |
| 6,739,729 B1 | 5/2004 | Blackmon | |
| 6,744,561 B2 | 6/2004 | Condo | |
| 6,989,924 B1 | 1/2006 | Jorgensen | |
| 7,041,187 B2 | 5/2006 | Park | |
| 7,309,398 B2 | 12/2007 | Blackmon | |
| 7,343,913 B2 | 3/2008 | Niedermeyer | |
| 7,345,137 B2 | 3/2008 | Hebrink | |
| 8,210,165 B2 * | 7/2012 | Forrester et al. | 126/698 |
| 2004/0118395 A1 * | 6/2004 | Rubbia et al. | 126/694 |
| 2007/0251569 A1 | 11/2007 | Shan | |
| 2009/0056704 A1 | 3/2009 | Donati | |
| 2009/0101195 A1 | 4/2009 | Reynolds | |
| 2010/0212717 A1 * | 8/2010 | Whitlock et al. | 136/246 |
| 2011/0177298 A1 * | 7/2011 | Gardiner | 428/178 |

FOREIGN PATENT DOCUMENTS

| | | | |
|---|---|---|---|
| DE | 10 2006 025 007 | | 12/2007 |
| DE | 102006025007 | * | 12/2007 |
| WO | 03-022578 | | 3/2003 |
| WO | WO 03022578 A1 | * | 3/2003 |
| WO | 2004-114419 | | 12/2004 |
| WO | 2009/022102 | | 2/2009 |
| WO | 2009-034226 | | 3/2009 |
| WO | WO 2009/089571 | | 7/2009 |

OTHER PUBLICATIONS

Vega energy, Almeco Group, Almeco Tinox Solar, product literature, May 2010, 8 pages.
Vegaflex, Almeco Spa, product literature, May 2010, 4 pages.
International Search Report of PCT/US2010/047431, mailed Nov. 8, 2010, 3 pages.

* cited by examiner

CONCENTRATING SOLAR MIRROR PANEL ASSEMBLY WITH CORRUGATED STIFFENER

CROSS-REFERENCE TO RELATED APPLICATION

This application is a national stage filing under 35 U.S.C. 371 of PCT/US2010/047431, filed Sep. 1, 2010, which claims the benefit of U.S. Provisional Application No. 61/239,265, filed Sep. 2, 2009, the disclosure of which is incorporated by reference herein in its entirety.

BACKGROUND

Concentrated solar power (CSP, also known as "concentrating solar power") technology uses sunlight directed at heat transfer fluids that heat up and whose thermal energy is then transferred (e.g., for heating) or turned into electrical power (e.g., by use of a turbine generator). CSP systems typically use lenses or reflectors and tracking systems to focus a large area of sunlight into a small beam. The concentrated sunlight is then used as a heat source for a conventional power plant (e.g., a steam driven turbine generator). A wide range of concentrating technologies exists; the most developed are the solar trough, parabolic dish and solar power tower.

Concentrating or concentrated photovoltaic (CPV) systems include photovoltaic cells or other photovoltaic materials that convert the energy within sunlight to electrical energy. Reflective, refractive, or both reflective and refractive elements are used to concentrate sunlight onto the photovoltaic cells or materials. The use of the reflective and/or refractive materials reduce the quantity of the more expensive photovoltaic materials required in the system.

For both CSP and CPV systems, it is important to accurately reflect solar energy on a target. In order for reflectors to maintain reflected solar energy on a target, they must hold their shape, and they must be able to withstand environmental challenges that may change their shape, position, or integrity. More difficulties in meeting these requirements may be encountered for CSP reflectors due to their relatively larger size.

CSP reflectors made of silver-coated glass panels are relatively expensive, heavy (e.g., more than two times heavier than its sheet metal analogs), difficult to handle, and fragile. Such glass panels may not stand up to extreme environments (e.g., high wind speeds, hail, and debris damage). Recent efforts have been made to make thin film systems to replace these glass based mirrors. Film systems are substantially lighter and more resistant to fracture than glass. However, such films alone are not stiff enough to accurately reflect energy on a target. Even film systems including lamination of the film substrate to an aluminum sheet (e.g., 0.025 to 0.13 centimeters thick) typically do not produce reflectors that are stiff enough to handle the extreme environmental conditions described above. Stiffening approaches include reinforcement with perforated panel and tab structures and the use of reinforcing ribs.

Despite the advances in the industry, reliable and cost-effective methods for stiffening or reinforcing reflectors for use in solar technologies are still needed.

SUMMARY

The present disclosure provides a concentrating solar mirror panel assembly having a reflective sheet and a corrugated stiffener joined to the reflective sheet, methods of making the concentrating solar mirror panel assembly, and concentrated solar power systems and photovoltaic solar collection devices that include the concentrating solar mirror panel assembly. The concentrating solar mirror panel assembly disclosed herein is assembled in a manner such that a desired non-planar shape is maintained in a substantially rigid fashion: either using a locking sheet or having the corrugated stiffener attached so that its principal axes of corrugation are substantially perpendicular to the axis of curvature of the assembly. Also, at least some of the ridges of the corrugation provide the attachment points to the reflective sheet, and at least some of the troughs of the corrugation provide the attachment points to the locking sheet when the locking sheet is present. The concentrating solar mirror panel assembly disclosed herein typically exhibits excellent accuracy, strength, and stiffness as discussed below. Furthermore, the concentrating solar mirror panel assemblies disclosed herein are substantially rigid on their own. That is, they do not require a supporting frame to hold them substantially rigid, which may allow relatively few attachment points between the assemblies a supporting frame.

The assembly can be readily manufactured from separate components (i.e., the reflective sheet, the corrugated stiffener, and, in some embodiments, the locking sheet are typically separately manufactured unitary components, which are then assembled). Advantageously, the separate components and consequently the assembly can be readily tuned to particular requirements (e.g., in a particular geographic location). The thicknesses of the separate components, the materials from which they are made, the joining methods, and the various parameters of the corrugation (e.g., height, pitch, land length, and/or acute angle between the reflective sheet and a side of a ridge of the corrugation) can all be selected to provide the most cost-effective solution that can achieve the required strength, stiffness, and accuracy.

In one aspect, the present disclosure provides a concentrating solar mirror panel assembly comprising:

a reflective sheet having a reflective major surface and an opposing major surface;

a corrugated stiffener having ridges and troughs each having an outer surface with land areas, wherein the land areas of at least a portion of the ridges are joined to at least a portion of the opposing major surface of the reflective sheet; and a locking sheet joined to at least a portion of the land areas of the troughs of the corrugated stiffener, wherein the concentrating solar mirror panel assembly is non-planar and substantially rigid. In some embodiments, the corrugated stiffener has principal axes of corrugation, and the concentrating solar mirror panel assembly has an axis of curvature that is substantially parallel to the principal axes of corrugation. In other embodiments, the concentrating solar mirror panel assembly has an axis of curvature that is substantially perpendicular to the principal axes of corrugation.

In another aspect, the present disclosure provides a concentrating solar mirror panel assembly comprising:

a reflective sheet having a reflective major surface and an opposing major surface; and a corrugated stiffener having principal axes of corrugation and having ridges and troughs each having an outer surface with land areas, wherein the land areas of at least a portion of the ridges are joined to at least a portion of the opposing major surface of the reflective sheet;

wherein the concentrating solar mirror panel assembly is non-planar and substantially rigid and has an axis of curvature that is substantially perpendicular to the principal axes of corrugation of the corrugated stiffener.

In another aspect, the present disclosure provides a concentrated solar power system comprising:

at least one concentrating solar mirror panel assembly disclosed herein capable of being aligned to direct solar radiation onto a hollow receiver; and a heat transfer fluid at least partially disposed within the hollow receiver.

In another aspect, the present disclosure provides a solar collection device comprising:

a photovoltaic cell; and a concentrating solar mirror panel assembly disclosed herein capable of being aligned to direct solar radiation onto the photovoltaic cell.

In some embodiments of the foregoing aspects, the land areas of at least a portion of the ridges are joined to at least a portion of the opposing major surface of the reflective sheet with adhesive. In some embodiments, the adhesive is a structural adhesive. In some embodiments, the adhesive is a pressure sensitive adhesive (e.g., tape).

In another aspect, the present disclosure provides a method of making a concentrating solar mirror panel assembly, the method comprising:

providing the reflective sheet having the reflective major surface and the opposing major surface;

attaching a corrugated stiffener to at least a portion of the opposing major surface of the reflective sheet, the corrugated stiffener comprising ridges and troughs each having an outer surface with land areas, wherein the land areas of at least a portion of the ridges are attached to the opposing major surface of the reflective sheet; and attaching a locking sheet to the land areas of at least a portion of the troughs.

In another aspect, the present disclosure provides a method of making a concentrating solar mirror panel assembly, the method comprising:

providing the reflective sheet having the reflective major surface and the opposing major surface;

attaching the corrugated stiffener to at least a portion of the opposing major surface of the reflective sheet, the corrugated stiffener comprising ridges and troughs each having an outer surface with land areas, wherein the land areas of at least a portion of the ridges are attached to the opposing major surface of the reflective sheet such that the principal axes of corrugation of the corrugated stiffener are substantially perpendicular to the axis of curvature of the reflective sheet. In some embodiments, the method further comprises attaching a locking sheet to the land areas of at least a portion of the troughs.

In some embodiments of the foregoing methods, attaching comprises adhering. In some embodiments, adhering is accomplished with a structural adhesive. In some embodiments, the adhering is accomplished with a pressure sensitive adhesive (e.g., tape). In some embodiments of the foregoing methods, the method further comprises forming the reflective sheet into a predetermined shape before attaching the corrugated stiffener to at least a portion of the opposing major surface of the reflective sheet.

In some embodiments, the method further comprises selecting a geographical location for the concentrating solar mirror panel assembly, the geographical location having an average wind speed;

receiving data comprising the average wind speed and a target weight of the concentrating solar mirror panel assembly; and generating a design for the concentrating solar mirror panel assembly, the design comprising a material composition and thicknesses of the reflective sheet, the corrugated stiffener, and optionally the locking sheet; a height between a top of the ridges and a bottom of the troughs; and an acute angle between the reflective sheet and a side of a ridge, wherein the design is based at least partially on information concerning strength and stiffness of the concentrating solar mirror panel assembly when exposed to the average wind speed. Examples of material compositions and thicknesses for each of the reflective sheet, the corrugated stiffener, and the locking sheet are provided in the following Detailed Description.

For some embodiments of the concentrating solar mirror panel assembly according to, prepared by, and/or useful for practicing the present disclosure, the following features can be selected individually or in any combination. The locking sheet may be coextensive with the corrugated stiffener, or there may be two or more locking sheets separated from each other and attached to portions of the land areas. Typically, the corrugated stiffener is coextensive with the reflective sheet. The reflective sheet may comprise a solar reflecting film laminate, or the reflective sheet may comprise at least one of a glass sheet or metallic sheet. The locking sheet and the corrugated stiffener each independently may comprise metal (e.g., aluminum or galvanized steel) or a polymer composite. Typically, the corrugated stiffener is neither extruded nor capable of being extruded. The concentrating solar mirror panel assembly may have a natural frequency of at least 30 Hz, as measured by finite element analysis (FEA) simulation. In the corrugated stiffener, an acute angle between the reflective sheet and a side of a ridge may be in a range from 40 to 89 (e.g., 60 to 80, 72.5 to 77.5, or 65 to 70) degrees.

In this application, terms such as "a", "an" and "the" are not intended to refer to only a singular entity, but include the general class of which a specific example may be used for illustration. The terms "a", "an", and "the" are used interchangeably with the term "at least one". The phrase "at least one of" followed by a list refers to any one of the items in the list and any combination of two or more items in the list. All numerical ranges are inclusive of their endpoints and non-integral values between the endpoints unless otherwise stated.

BRIEF DESCRIPTION OF THE DRAWINGS

The disclosure may be more completely understood in consideration of the following detailed description of various embodiments of the disclosure in connection with the accompanying drawings, in which:

FIG. 2b is a representative schematic cross-sectional view through line 2b-2b of FIG. 1a.

DETAILED DESCRIPTION

Figure 1A:
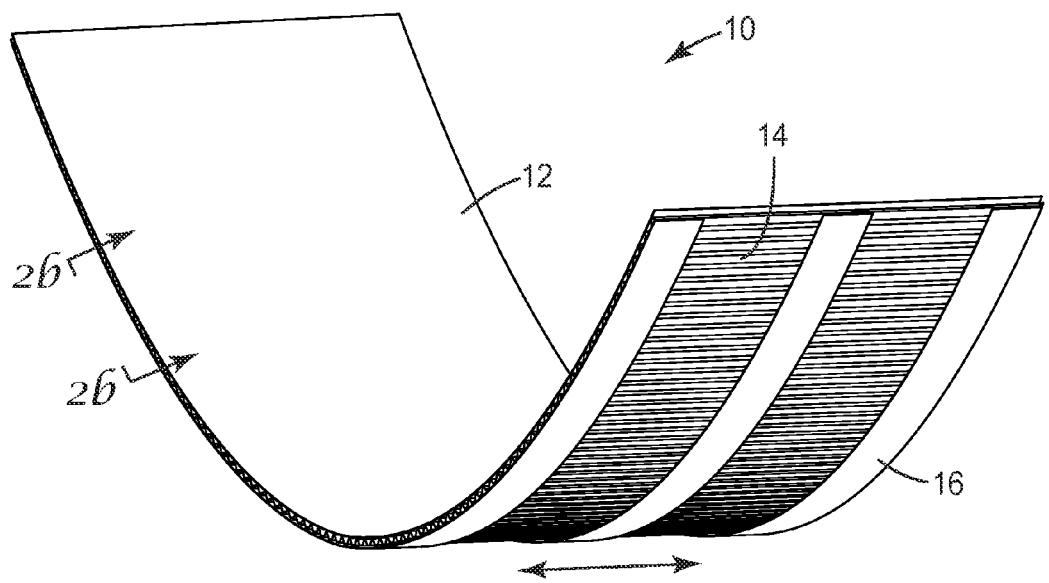
FIG. 1a is a perspective view of a concentrating solar mirror panel assembly 10 according to one embodiment of the present disclosure.

FIGS. 1a, 1b, 1c, and 1d illustrate exemplary concentrating solar mirror panel assemblies 10, 10b, 10c, and 10d, respectively, according to the present disclosure. The concentrating solar mirror panel assemblies according to the present disclosure, including the reflective sheet, are non-planar (i.e., not flat). The illustrated embodiments in FIGS. 1a, 1b, 1c, and 1d are parabolic. However, other shapes are possible (e.g., cylindrically curved or otherwise curved troughs). Typically, the reflective sheet 12 has a reflective major surface that is a concave surface. In some embodiments of the concentrating solar mirror panel assembly according to, prepared by, and/or useful for practicing the present disclosure, non-planar refers to having a radius of curvature (e.g., up to about 1600 meters, 10 meters, 5 meters, 3 meters, or 1 meter) in at least one direction. In some embodiments, the concentrating solar mirror panel assembly may have radii of curvature in two orthogonal directions.

Concentrating solar mirror panel assemblies according to the present disclosure are also substantially rigid. The term "substantially rigid" refers to the ability of the assembly to hold its shape. Typically, the substantially rigid concentrating solar mirror panel assembles can hold their shape while subjected to wind loadings of at least 50, 75, 80, 90, 100, 110, 120 or 125 miles per hour (mph) (80.5, 120, 129, 145, 160, 177, 193, or 200 kilometers per hour (kph)). The assemblies' ability to hold their shape can be related to their accuracy in keeping reflected radiant energy on its target, for example, while subjected to the wind loadings above. In some embodiments, the concentrating solar mirror panel assemblies maintain on target at least 90 (e.g., 92, 95, 97, 98, 99, or 99.5) of the solar energy it reflects while subjected to wind loadings of at least 50 mph (80.5 kph). Such accuracy can be measured by finite element analysis (FEA) simulation, for example, using techniques known in the art and described in the Example section below. In comparison, conventional glass mirrors having a thickness of 4 millimeters (mm), reflect on target only about 80 percent of the incident solar vector while subjected to wind loadings of at least 50 mph (80.5 kph), as measured by FEA simulation (details of the calculation can be found in the "Modeling Method and Examples 1 to 17" section). In some embodiments, the concentrating solar mirror panel assembly has a natural frequency above that of glass, which has a natural frequency of about 20 Hz for 4-mm thick glass as measured by FEA simulation. In some embodiments, the concentrating solar mirror panel assembly has a natural frequency of at least 30 (e.g., at least 40, 50, 60, 70, or 80) Hz, as measured by FEA simulation, and may be as high as 90, 95, 100, or even 105 Hz. Natural frequency may also be measured in a laboratory using techniques known to a person having ordinary skill in the art. Also, stiffness of the concentrating solar mirror panel assembly can be measured using other conventional techniques (e.g., a 3-point bend test) to be higher than the stiffness of 4-mm thick glass.

Referring again to FIGS. 1a, 1b, 1c, and 1d, reflective sheet 12 may be formed of any reflective material (i.e., reflective of electromagnetic radiation, such as solar radiation). Reflective sheet 12, according to some embodiments, comprises a glass sheet (e.g., a glass mirror or glass on metal laminate). In some of these embodiments, the reflective sheet is non-rigid and has a glass thickness of up to 3 mm (0.12 inches), up to or less than 2 min (0.08 inches) or up to one mm (0.04 inches), for example, in a range from (0.2, 0.3, 0.4, or 0.5 mm up to 0.75, 0.95, 0.99, 1, 2, or 3 mm). Other suitable glass thicknesses may also be used. The glass sheet may also have a topcoat (e.g., copper) and mirror backing paint.

In other embodiments, reflective sheet 12 comprises a reflective solar film laminate (e.g., comprising a polymer film such as a polyester or acrylic polymer film). The reflective polymeric film may be, for example, a metalized (e.g., silver or aluminum coated by vapor deposition techniques) polymeric film or a reflective multi-layer optical film, which may or may not be metalized. The polymer film may be laminated to a metal substrate (e.g., aluminum or galvanized steel). Useful examples of metalized solar reflective film laminates can be found, for example, in U.S. Pat. No. 6,989,924 (Jorgensen et al.), U.S. Pat. No. 4,645,714 (Roche, et al.), and U.S. Pat. No. 6,088,163 (Gilbert et al.). Useful examples of reflective multi-layer optical films can be found, for example, in U.S. Pat. No. 6,744,561 (Condo et al.) and U.S. Pat. No. 7,345,137 (Hebrink et al.). Use of a film laminate may decrease the weight of the mirror by up to about 85 percent when compared to a comparable glass mirror. The decrease in weight allows for easier installation and replacement operations since it is typically possible for one individual to carry the mirror. In parabolic troughs, one mirror film laminate can be used to replace multiple glass mirrors.

In some embodiments of reflective sheet 12, including embodiments that include either a glass sheet or a polymeric film, the reflective sheet includes a metal sheet (e.g., an aluminum or galvanized steel sheet). In some of these embodiments, the metal sheet has a thickness of up to 2 millimeters (mm) (0.08 inches) or up to one mm (0.04 inches), for example, in a range from (0.2, 0.3, 0.4, or 0.5 mm up to 0.75, 0.95, 0.99, or 1 mm). Other suitable thicknesses for the metal sheet may also be used. The metal sheet may be preformed by known forming processes (e.g., stamping).

Referring now to FIGS. 1a, 1b, 1c, 1d, 2a, and 2b, corrugated stiffener 14, 14c, 14d has ridges 22, 22b and troughs 26, 26b, each having an outer surface with land areas 28, 28b. Corrugated stiffener 14, 14c, 14d may be made from metal or a polymer composite or any suitable material. Typically, corrugated stiffener 14, 14c, 14d is made from metal (e.g., aluminum or galvanized steel). In the embodiment illustrated in FIG. 2b, and area 28 is substantially flat. Substantially flat land areas 28 typically allow for better attachment (e.g., adhesive bonding) of ridges 22 to reflective sheet 12 and troughs 26 to locking sheet(s) 16 using the joining techniques discussed below. In some embodiments (e.g., the embodiment shown in FIG. 2b) the land area 28 has a length of up to 25 millimeters (mm) (0.98 inches) or up to 23 mm (0.9 inches), for example, in a range from 5, 6, 7, 8, 9, or 10 mm up to 20, 21, 22, 23, 24, or 25 mm. In other embodiments, including the embodiment illustrated in FIG. 2a, which shows a sinusoidal shaped corrugation, the land areas 28b can be curved. In these embodiments, the land areas have an arc length which correlates to the land area length for a substantially flat land area (e.g., in a range from 5, 6, 7, 8, 9, or 10 mm up to 20, 21, 22, 23, 24, or 25 mm). In other embodiments, the land areas can be angular (e.g., in a saw tooth shaped corrugation). In some embodiments, corrugated stiffener 14, 14c, 14d has a thickness "t" of up to 2 millimeters (mm) (0.08 inches) or up to one mm (0.04 inches), for example, in a range from (0.15, 0.2, 0.3, 0.4, or 0.5 mm up to 0.75, 0.95, 0.99, or 1 mm). Other suitable thicknesses "t" for corrugated stiffener 14, 14a may also be used. In some embodiments, the length of the land area 28 is at least 2.5, 3, 4, or 5 times a thickness of the corrugated stiffener; in these embodiments, a saw tooth configuration is excluded. In some embodiments, corrugated stiffener 14, 14c, 14d has a height from the top of the ridges to the bottom of the troughs in a range from 6 mm (0.24 inches) to 50 mm (2.0 inches) or typically from 10 mm (0.4 inches) to 15 mm (0.6 inches). The height of corrugation may be, for example, in a range from 10, 11, 12, 13, 14, or 15 mm up to 25, 30, 35, 40, 45 or 50 mm. Some useful corrugated metal sheets are commercially available, for example, from Flexospan Steel Buildings, Inc., Sandy Lake, Pa. (e.g., under the trade designation "FLEXBEAM").

Figure 1B:
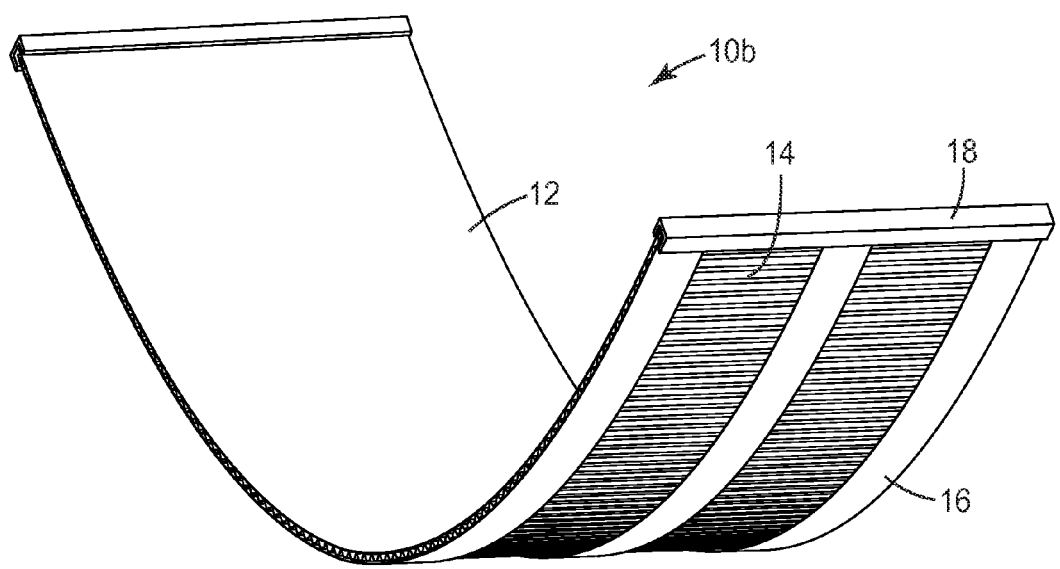
FIG. 1b is a perspective view of a concentrating solar mirror panel assembly 10b according to another embodiment of the present disclosure.

In the exemplary embodiments illustrated in FIGS. 1a and 1b, the principal axes of corrugation are substantially parallel to the axis of curvature. "Principal axes of corrugation" refer to direction along the lengths of the ridges and troughs of the corrugation. "Substantially parallel" means that the principal axes of corrugation and the axis of curvature deviate from each other by up to 10 degrees, in some embodiments up to 7.5, and in some embodiments up to 5 degrees). A direction substantially parallel to the principal axes of corrugation is shown with the double-sided arrow in FIG. 1a.

Figure 2A:
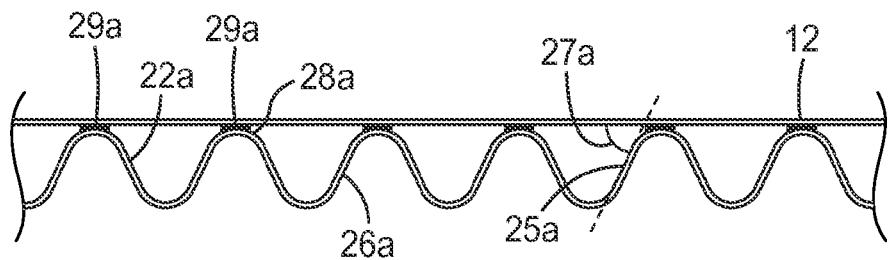
FIG. 2a is a representative schematic cross-sectional view through line 2a-2a of FIG. 1c.
Figure 2B:
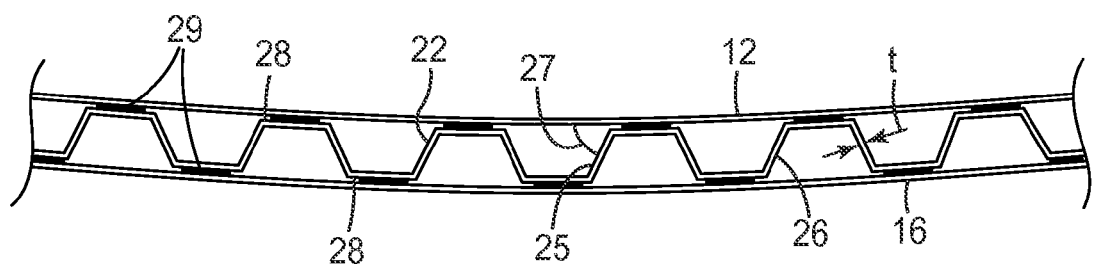

In some embodiments, including the embodiment illustrated in FIG. 2b, the acute angle 27 between the reflective sheet 12 and a side 25 of ridge 22 in corrugated stiffener 14 is in a range from 40 to 89 (e.g., 60 to 80, 72.5 to 77.5, or 65 to 70) degrees. The acute angle is defined with reference to a cross section orthogonal to the principal axes of corrugation, such as the cross section depicted in FIG. 2b. In some embodiments, particularly where the side 25 is essentially linear in the cross-section such as depicted in FIG. 2b, the acute angle 27 is defined as the angle between the reflective sheet 12 and the linear side 25 in the cross-section. Although an angle 27 of about 45 degrees was expected to provide the most stable structure in a concentrating solar mirror panel assembly 10, it was surprisingly found that higher acute angles in a range from 60 to 80 degrees provided assemblies that were stronger and stiffer than when the corrugated stiffener had lower acute angles, as determined by FEA simulation. The larger angle increases the number of corrugations which increases the stiffness, allowing for minimal strength changes when decreasing the thickness from 0.016 inch (0.4 mm) to 0.010 inch (0.25 mm) and decreasing the weight per reflector area by 45% (see Examples 5 and 6 below). The relationship between strength and stiffness and acute angle 27 was not previously known. With low acute angles 27 (e.g., 30 or less) or large angles (e.g., 90 or greater) a decrease in stiffness and strength was observed by FEA, possibly due to bending or buckling of the corrugations. As the angle increases from 30 to 75 degrees, the stiffness and strength increased. In concentrating solar mirror panel assembly 10, the most effective acute angle 27 varied somewhat in the range from 60 to 80 degrees depending on the length of land areas 28. The relationship between strength and stiffness, acute angle 27, and length of land areas 28 is shown in the Examples, below, and illustrated in FIG. 3.

In some embodiments, including the embodiment illustrated in FIG. 2a, wherein the principal axes of corrugation are substantially perpendicular to the axis of curvature, the acute angle between reflective sheet 12 and a side 25a of a ridge 22a in corrugated stiffener 14c is in a range from 20 to 89 (e.g., 20 to 80, 20 to 55, or 25 to 50) degrees. The acute angle 27a is defined with reference to a cross section orthogonal to the principal axes of corrugation, such as the cross section depicted in FIG. 2a. In some embodiments, particularly where the side 25a comprises an essentially linear portion between concave and convex curves such as depicted in FIG. 2a, the acute angle 27a is defined as acute angle between the reflective sheet 12 and the intermediate linear portion of the side 25a of the ridge 22a in the cross-section. In some embodiments, particularly where the side 25a is continuously curved and has no linear portion, the acute angle 27a is defined as the acute angle between the reflective sheet 12 and a line tangent to the side 25a which forms the greatest acute angle with the reflective sheet, i.e., closest to 90 degrees.

Referring again to FIGS. 1a and 1b, locking sheet(s) 16 generally maintains a particular desired non-planar shape in the concentrating solar mirror panel assembly 10, 10b. The locking sheet(s) 16 can be made from metal or a polymer composite or any suitable material. Typically, locking sheet(s) 16 is made from metal (e.g., aluminum or galvanized steel). In some embodiments, locking sheet 16 and corrugated stiffener 14 are made from the same metal. In some of these embodiments, locking sheet 16 has a thickness of up to 2 millimeters (mm) (0.08 inches) or up to one mm (0.04 inches), for example, in a range from (0.15, 0.2, 0.3, 0.4, or 0.5 mm up to 0.75, 0.95, 0.99, or 1 mm). Other suitable thicknesses for locking sheet 16 may also be used. The locking sheet(s) 16 may have features to increase their stiffness (e.g. corrugations or ribs) and/or to reduce their weight (e.g. perforations).

Figure 1C:
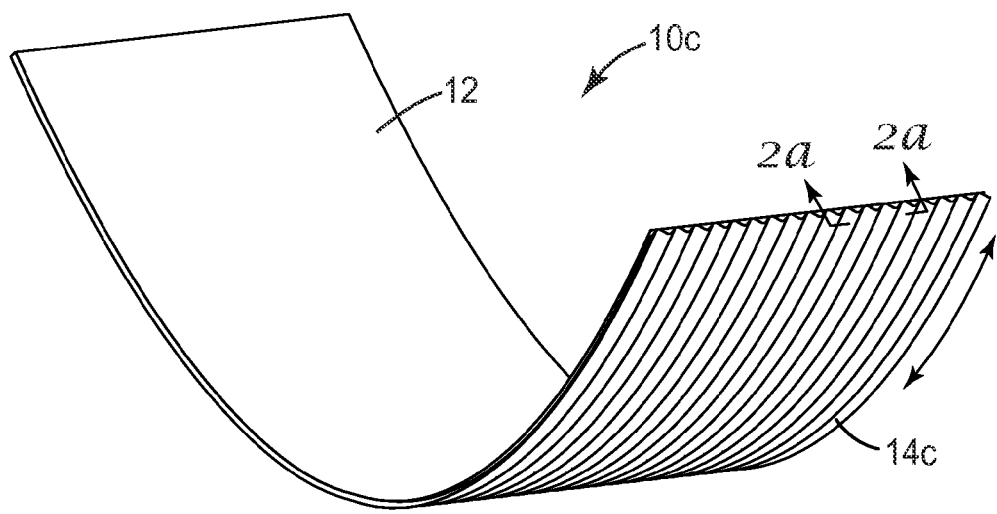
FIG. 1c is a perspective view of a concentrating solar mirror panel assembly 10c according to yet another embodiment of the present disclosure.

In some embodiments, including the exemplary embodiment illustrated in FIG. 1c, a locking sheet (not shown) is optional since concentrating solar mirror panel assembly 10c is capable of holding a substantially rigid, non-planar shape when the curved corrugated stiffener 14c is curved such that its axis of curvature is substantially perpendicular to the principal axes of corrugation. The direction of the principal axes of corrugation for concentrating solar mirror panel assembly 10c is shown by the double sided arrow in FIG. 1c. "Substantially perpendicular" means that the principal axes of corrugation and the axis of curvature deviate from each other by an amount in a range from 80 to 100 degrees, in some embodiments, in a range from 85 to 95 degrees, and in some embodiments, in a range from 87.5 to 92.5 degrees. In some embodiments of concentrating solar mirror panel assemblies having a curved corrugating stiffener 14c, further stiffening of the panel may be accomplished by interconnecting one or more ridges of the corrugations with a locking sheet or locking sheet portions (e.g., strips) at one or more positions along the ridges. The locking sheet or locking sheet portions may have any of the features described above in embodiments of locking sheet 16.

Figure 1D:
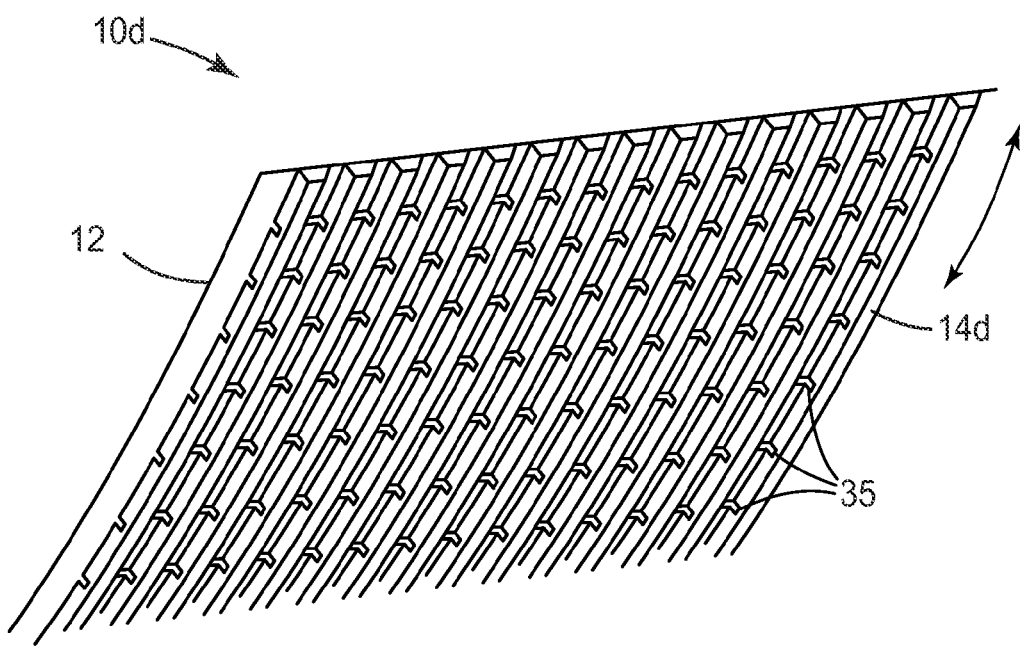
FIG. 1d is a perspective view of a concentrating solar mirror panel assembly 10d according to yet another embodiment of the present disclosure.

FIG. 1d illustrates an embodiment wherein at least a portion of the ridges of the corrugated stiffener is provided with perforations 35. The perforations 35 may be formed in the ridges so that they extend only partially into the troughs. For example, perforations 35 may extend to about midway between the outer surfaces of the ridges and the troughs, although they may extend to a greater or lesser extent. The perforations 35 are typically provided so that they are substantially perpendicular to the principal axes of corrugation, which is shown by the double sided arrow in FIG. 1d, and each perforation may span a ridge. The perforations 35 may be positioned in any desired configuration. For example, the perforations 35 may be aligned so that perforations 35 in adjacent ridges are side-by-side. In other embodiments, adjacent ridges may have perforations 35 that are staggered in a direction perpendicular to their principal axes of corrugation. The perforations may be evenly spaced along the corrugations, or they may be unevenly spaced. Perforations 35 may be useful, for example, for allowing curvature in the corrugated stiffener and for reducing the weight of the assembly. In embodiments where at least a portion of the troughs is provided with perforations, the assembly may be provided with a locking sheet as described above.

Corrugated stiffeners 14, 14c, 14d as shown in FIGS. 1a through 1d, have one ply. However, it is envisioned that corrugation having more than one ply (e.g., 2, 3, 4, or more plies) may also be useful for practicing the present disclosure). In some embodiments wherein the corrugation has more than one ply, a first ply has principal axes of corrugation substantially parallel to the axis of curvature of the concentrating solar mirror panel assembly, and a second ply has principal axes of corrugation substantially perpendicular to the axis of curvature of the concentrating solar mirror panel assembly. In some of these embodiments, the first ply has ridges and troughs each having land areas, wherein the land areas of at least a portion of the ridges are joined to at least a portion of the opposing major surface of the reflective sheet. In some of these embodiments, the second ply forms the locking sheet. In other embodiments, the second ply has ridges and troughs each having land areas, wherein the land areas of at least a portion of the ridges are joined to at least a portion of the opposing major surface of the reflective sheet. In some of these embodiments, the first ply is joined to at least a portion of the land areas of the troughs of the second ply.

Concentrating solar mirror panel assemblies according to the present disclosure may be useful, for example, in large solar field installations. In some embodiments, the concentrating solar mirror panel assembly has a dimension (e.g., an arc length) of at least 10 feet (3 meters) (e.g., at least 12 feet (3.7 meters) and up to 15 or 20 feet (4.6 to 6.1 meters)). In some of these embodiments, the reflective sheet is a unitary component, and in some of these embodiments, the corrugated stiffener is a unitary component. Since the concentrating solar mirror panel assemblies have been shown to be stiff and strong at wind speeds of up to 156 mph (about 250 kph), they are expected to be useful in smaller constructions as well.

Various configurations of the concentrating solar mirror panel assemblies are envisioned. In some embodiments of concentrating solar mirror panel assemblies according to, prepared by, and/or useful for practicing the present disclosure, the locking sheet is coextensive with the corrugated stiffener, and the corrugated stiffener is coextensive with the reflective sheet. The term "coextensive" with regard to the corrugated stiffener means that the corrugated stiffener covers the entire area of the reflective sheet, with the end of the corrugated stiffener meeting the end of the reflective sheet. Coextensive generally means having the same dimensions; however, in curved constructions the arc length of a convex face should be understood to be longer than the arc length of a concave face. In other embodiments, separated corrugated stiffeners are attached to only portions of the opposing major surface of the reflective sheet or a single corrugated stiffener may be used that is smaller than the opposing major surface of the reflective sheet. For example, at least 50, 60, 75, 80, 85, 90, 95, or 99 percent of the surface area of the opposing major surface is covered by a corrugated stiffener or separated corrugated stiffeners. In other embodiments, the corrugated stiffener may extend farther than the reflective sheet. In some embodiments, including the embodiment illustrated in FIG. 1c, the reflective sheet may have more than one (e.g., at least 2, 3, 4, or more) curved corrugated stiffeners attached to the opposing major surface of the reflective sheet. If more than one curved corrugated stiffener is used, each curved corrugated stiffener may have the same or different radii of curvature to account for the shape of the final assembly. In some embodiments, two or more reflective sheet portions may be joined to the corrugated stiffener, for example, with separation between the reflective sheet portions. In some embodiments, including the embodiments shown in FIGS. 1a and 1b, the corrugated stiffener 14 may extend farther than the locking sheet 16. For example, two or more locking sheet portions or strips 16 may be joined to the corrugated stiffener, for example, with separation between the locking sheet portions 16 as shown in FIGS. 1a and 1b. The locking sheet or strips are generally designed to cover a significant portion of the corrugated stiffener. For example, at least 25, 30, 40, 50, 60, 75, 80, 85, 90, 95, or 99 percent of the concentrating solar mirror panel assembly is covered by the locking sheet or the separated locking strips. The locking sheet or strips generally have uniform thicknesses. Generally, the locking sheet does not include arms of a supporting frame onto which the corrugated stiffener is placed. The overall thickness and focal line of the concentrating solar mirror panel assembly according to the present disclosure are typically similar to that of a conventional glass solar concentrating mirror.

Concentrating solar mirror panel assemblies 10, 10b, 10c, 10d may include, in some embodiments, additional structural elements (not shown), for example, between reflective sheet 12 and corrugated stiffener 14, 14c, 14d. For example, a thin layer of fiberglass composite, or similarly applied other suitable material, can be used when the reflective sheet comprises a glass sheet to provide strength to the glass sheet. The fiberglass composite or similarly applied other suitable material may, for example, be bonded, or otherwise attached, to a bottom surface of the reflective sheet 12 before the concentrating solar mirror panel assembly 10, 10b, 10c, 10d is shaped to have a selected curvature. In embodiments where the reflective sheet includes a thin glass sheet, when the concentrating solar mirror panel assembly 10, 10b, 10c, 10d is shaped to have a selected curvature, the fiberglass fibers, for example, may be placed in tension, and the thin glass may be placed in compression to enhance the strength of the glass. The concentrating solar mirror panel assemblies may further include modifications to allow secure attachment of the mirror panels to a supporting frame structure. These modifications will vary according to the support frame design and the design of the panels.

In the embodiment shown in FIG. 1b, concentrating solar mirror panel assembly 10b has end-caps 18 enveloping at least two opposing edges of the concentrating solar mirror panel assembly 10b. End-caps 18 may be useful, for example, for holding the position of the reflective sheet 12, corrugated stiffener 14, and locking sheet(s) 16 relative to each other. The materials and thicknesses useful for locking sheet(s) 16 described above may also be useful for the end-caps. Typically, the same material is used to make corrugated stiffener 14, locking sheet(s) 16, and end-caps 18. End-caps 18 typically have portions parallel to the concentrating solar mirror panel assembly that extend up to about 5 percent beyond the length of the assembly. In some embodiments, the portions of end-caps 18 parallel to the concentrating solar mirror panel assembly may have different lengths along reflective sheet 12 and locking sheet(s) 16. In some embodiments, the portion of the end-cap 18 parallel to the assembly on the locking sheet(s) side of the assembly is longer than the portion of the end-cap 18 parallel to the assembly on the reflective sheet side. The end-cap 18 may be designed to only minimally cover the reflective sheet. For example, end-cap 18 may wrap around the edge of the concentrating solar mirror panel assembly on the locking sheet side of the assembly but be positioned adjacent the edge of the assembly on the reflective sheet side of the assembly without overlapping the edge on this side to cover the reflective sheet.

In concentrating solar mirror panel assembly 10, 10b, 10c, 10d corrugated stiffener 14, 14c, 14d can be attached to reflective sheet 12 and locking sheet(s) 16 using any suitable method (e.g., adhesives, tapes, rivets, toggle-locks, or welds) to connect the sheets and maintain the spacing necessary for good optical accuracy. Similarly, any of these methods can be used to connect end-caps 18 to concentrating solar mirror panel assembly 10b. In some embodiments, including the embodiments shown in FIGS. 2a and 2b, the components of the concentrating solar mirror panel assembly 10, 10b, 10c are joined together with adhesive 29, 29a. In some embodiments, the adhesive is a crosslinking adhesive (e.g., an epoxy resin or acrylic adhesive) that is applied to the land areas of the corrugated stiffener before the reflective sheet and, in some embodiments, the locking sheet are attached. The crosslinking adhesive is subsequently cured. Several useful crosslinking adhesives are commercially available (e.g., an epoxy adhesive available from 3M Company, St. Paul, Minn. under the trade designation "SCOTCHWELD DP420"). In some embodiments, the adhesive is a pressure sensitive adhesive (e.g., tape such as an acrylic foam tape), which also may be applied to the land areas of the corrugated stiffener. Exemplary useful pressure sensitive adhesive tapes include an acrylic foam tape available from 3M Company under the trade designation "VHB TAPE 4920" and structural bonding tapes available from 3M Company under the trade designation "9244". The method for attaching the corrugated stiffener to the reflective sheet and to the locking sheet may be independently selected. For example, the corrugated stiffener can be adhered to the reflective sheet but welded or togglelocked to the locking sheet. In another example, adhesives can be used to attach both components to the corrugated stiffener, but different adhesives could be used to attach the corrugated stiffener to the reflective sheet and the locking sheet, respectively. Also, an adhesive that may be used to attach end-cap 18 to the concentrating solar mirror panel assembly may be selected independently from the adhesives used to attach corrugated stiffener 14 to reflective sheet 12 and locking sheet(s) 16. Typically, the adhesive is a structural adhesive (e.g., an epoxy adhesive or a structural pressure sensitive adhesive tape). The attachment method is not limited to those listed above and may be chosen based on the specific needs of the application as would be understood by a person skilled in the art.

In some embodiments, the reflective sheet is formed into a predetermined shape before attaching the corrugated stiffener to the reflective sheet. In some of these embodiments, the reflective sheet includes a metal sheet (e.g., aluminum or galvanized steel) as described above. In some embodiments, the locking sheet is formed into a predetermined shape before attaching the corrugated stiffener to the locking sheet and the reflective sheet to the corrugated stiffener. The reflective sheet and/or locking sheet may be formed into a predetermined shape using any number of techniques known to those skilled in the art (e.g., stamping or using the curved surface of a forming jig). If a forming jig is used, its curved surface can be concave or convex, depending on the desired shape of the concentrating solar mirror panel assembly. The shape of the forming jig may be designed, for example, to account for any spring-back that may occur in the final assembly.

For embodiments that include curved corrugated stiffeners (e.g., those illustrated in FIG. 1c), the curved corrugated stiffeners may be produced by any number of techniques known by those skilled in the art. For example, curved corrugated stiffeners can be produced using a curving mill as is used to produce curved corrugated metal roof panels. Crimp curve methods may also be useful, and useful multi-radius crimp-curved corrugated sheets may be obtained commercially, for example, from Curveline, Inc., Ontario, Canada. Another means of manufacture of the curved metal corrugated stiffener may be through a metal stamping operation as is known in the automotive industry. If the curved corrugated stiffener is a reinforced plastic, such as sheet molding compound (SMC), then it may be formed in a SMC press, as is known in the industry. During the forming process it may be necessary to compensate for the difference in the shape of the curvature of the curved corrugated stiffener and the final desired shape of the concentrating solar mirror panel assembly. For example, if the desired shape of the concentrating solar mirror panel assembly is parabolic (e.g., wherein reflective sheet is parabolic), while the shape of the curved corrugated stiffener(s) is/are arc-shaped, the shaping jig may be designed to compensate for the differences in curvature so that the final part has the desired shape. The radius of curvature for the curved corrugated stiffener(s) and the number of these stiffeners may be optimized to most effectively produce the desired shape of the reflective major surface. In embodiments having corrugation with more than one ply, with the first ply connected to the reflective sheet having principal axes of corrugation substantially parallel to the axis of curvature of the concentrating solar mirror panel assembly, the first ply can accommodate any curvature differences between the reflective sheet and a curved corrugated stiffener used as a second ply. The curved corrugated stiffener generally has principal axes of corrugation substantially perpendicular to the axis of curvature of the concentrating solar mirror panel assembly.

In some embodiments, including the embodiment illustrated in FIG. 1d, a curved corrugated stiffener is produced by providing perforations in at least a portion of the ridges of the corrugated stiffener. The placement of the perforations can be adjusted depending on the desired shape of the corrugated stiffener and can be staggered or aligned, evenly spaced or unevenly spaced as described above. The perforations are typically provided so that they are longer in a direction perpendicular to the principal axes of corrugation. The perforations can be made using a variety of methods. For example, a punch press or drill can be used to form the perforations. In other embodiments, the perforations may be kerfs formed, for example, by cutting into the ridges using a laser, saw blade, or other cutting device.

Concentrated solar power systems according to the present disclosure include solar troughs, parabolic dishes, and power towers, which include a heat transfer fluid partially disposed within a hollow receiver. The hollow receivers may be transparent or opaque and should typically be made of material (e.g., metal or glass) that is capable of withstanding the light and heat directed upon it by the broadband reflectors. Exemplary heat transfer fluids include water, water/glycol mixtures, brine, molten salts, and oils, with the selected typically being dictated by application requirements and cost. Often the hollow receivers comprise an interior pipe coated with a solar absorbing material disposed inside an exterior transparent (e.g., glass) pipe, although other configurations may also be used. In some embodiments, the heated heat transfer fluid flowing through the solar absorbing hollow receiver exchanges heat with water to create steam that drives an electric generator.

In some embodiments, the concentrated solar power system is a solar trough. In some of these embodiments, the solar trough includes a concentrating solar mirror panel assembly according to the present disclosure shaped into a linear parabolic reflector that concentrates sunlight onto a receiver positioned along the reflector's focal line. The reflector can be made to follow the sun during the daylight hours by tracking along a single axis using conventional celestial tracking mechanisms.

In some embodiments, the concentrated solar power system is a parabolic dish system, which includes a concentrating solar mirror panel assembly according to the present disclosure shaped into a stand-alone parabolic dish reflector that concentrates sunlight onto a receiver positioned at the reflector's focal point. The reflector tracks the sun along two axes using conventional celestial tracking mechanisms.

In some embodiments, the concentrated solar power system is a solar power tower. Power towers generally offer higher solar concentration ratios (e.g., in excess of 1000 times more) and better energy storage capability than other concentrated solar power systems. In some of these embodiments, several concentrating solar mirror panel assemblies according to the present disclosure are used as heliostats to concentrate light onto a hollow receiver tower. In some of these embodiments, the radius of curvature of the concentrated solar mirror panel assembly is in the range from 20 meters to 1600 meters. The curvature may be in one direction or in two (e.g., orthogonal) directions.

Solar collection devices according to the present disclosure include a photovoltaic cell and at least one concentrating solar mirror panel assembly according to the present disclosure. Suitable photovoltaic cells include those that have been developed with a variety of materials each having a unique absorption spectra that converts solar energy into electricity. Each type of material will have a characteristic band gap energy which causes it to absorb light most efficiently at certain wavelengths of light, or more precisely, to absorb electromagnetic radiation over a portion of the solar spectrum. Examples of materials used to make solar cells and their solar light absorption band-edge wavelengths include crystalline silicon single junction (about 400 nm to about 1150 nm), amorphous silicon single junction (about 300 nm to about 720 nm), ribbon silicon (about 350 nm to about 1150 nm), CIGS (Copper Indium Gallium Selenide) (about 350 nm to about 1100 nm), CdTe (about 400 nm to about 895 nm), GaAs multi junction (about 350 nm to about 1750 nm). The shorter wavelength left absorption band edge of these semiconductor materials is typically between 300 nm and 400 nm.

In some embodiments, concentrating solar mirror panel assemblies according to the present disclosure, in combination with an array of photovoltaic cells or hollow receivers, can be placed on conventional celestial tracking devices. For example, in some embodiments of a concentrated solar power system disclosed herein, at least one of the hollow receiver or the concentrating solar mirror panel assembly is connected to one or more celestial tracking mechanisms (i.e., the hollow receiver is connected to one or more celestial tracking mechanisms, the concentrating solar mirror panel assembly is connected to one or more celestial tracking mechanisms, or both the hollow receiver and the concentrating solar mirror panel assembly are connected to one or more celestial tracking mechanisms). Similarly, in some embodiments of a solar collection device disclosed herein, at least one of the photovoltaic cell or the concentrating solar mirror panel assembly is connected to one or more celestial tracking mechanisms (i.e., the photovoltaic cell is connected to one or more celestial tracking mechanisms, the concentrating solar mirror panel assembly is connected to one or more celestial tracking mechanisms, or both the photovoltaic cell and the concentrating solar mirror panel assembly are connected to one or more celestial tracking mechanisms). The hollow receiver or photovoltaic cell and/or the concentrating solar mirror panel assembly may be pivotally mounted on a frame. In some embodiments, both the hollow receiver or photovoltaic cell and the concentrating solar mirror panel assembly are pivotally mounted on a frame. The pivotally mounted components may pivot, for example, in one direction or in two directions. In some embodiments, the hollow receiver or photovoltaic cell is stationary. Exemplary celestial tracking devices that may be useful for solar collection devices disclosed herein are described in US Pat. App. Pub. No. 2007/0251569 (Shan et al.).

Concentrating solar mirror panel assemblies according to the present disclosure offer significant advantages over conventional glass panels that are not stiffened. The efficiency of 4-mm glass under wind loading and the stiffness of 4-mm glass are significantly less than those of the concentrating solar mirror panel assembly disclosed herein. Glass is also predicted by FEA simulation to have catastrophic failure issues due to its brittle nature under a 90 mph (145 kph) wind loading. None of the concentrating solar mirror panel assemblies of the present disclosure catastrophically failed under the sample wind conditions described in the Example section below. While the concentrating solar mirror panel assemblies disclosed herein may fail to completely regain their shape after a wind event, they will not break up and become debris to be carried down wind endangering the remaining solar field, public property, or lives.

The concentrating solar mirror panel assemblies disclosed herein also offer advantages over other types of reflectors. A type of solar reflector is reported in Int. Pat. Appl. Pub. No. WO 2004/114419 (Schripsema), which has a plurality of web members that connect an inner surface to an outer surface in a truss arrangement. These web members are not provided as a single component. The plurality of web members of Schripsema is generally formed by extrusion; therefore, if a different design is desired for a particular application, an investment in a new extrusion die is required. Also, extrusion of very large panels required in CSP applications (e.g., having a dimension of at least 10 feet) would not be possible. In contrast, the corrugated stiffener useful in practicing the present disclosure is generally provided as a single component with parameters that may be chosen and readily changed depending on the application. The corrugated stiffener disclosed herein can be readily joined to the reflective sheet and the optional locking sheet using the techniques described above.

While a thicker concentrating solar mirror panel assembly according to the present disclosure (i.e., having at least one of a thicker reflective sheet, a thicker corrugated sheet, a corrugated sheet with a higher height, or a thicker locking sheet) typically yields stiffer and stronger panels, the resulting weight of the assembly must be balanced against other factors. For example, a thicker panel may not be able to directly replace a glass analog in existing solar fields. A thicker panel also typically has a higher mass and cost. Using the concentrating solar mirror panel assemblies and the methods of making them described herein, it is possible to balance stiffness, mass, and performance under wind loadings. Infinite mechanical life at 156-mph (about 250 kph) can be achieved as determined by FEA simulation described in the Examples below, even when the thickness of the components is only 0.01 inch (0.25 mm). Such performance makes the concentrating solar mirror panel assembly useful for hurricane prone areas such as Florida or Latin America. Even thinner, lighter assemblies may be useful in more stable areas such as the South West United States or the Sahara in Northern Africa.

Selected Embodiments of the Disclosure

In a first embodiment, the present disclosure provides a concentrating solar mirror panel assembly comprising:

a reflective sheet having a reflective major surface and an opposing major surface;

a corrugated stiffener having ridges and troughs each having an outer surface with land areas, wherein the land areas of at least a portion of the ridges are joined to at least a portion of the opposing major surface of the reflective sheet; and a locking sheet joined to at least a portion of the land areas of the troughs of the corrugated stiffener, wherein the concentrating solar mirror panel assembly is non-planar and substantially rigid.

In a second embodiment, the present disclosure provides the concentrating solar mirror panel assembly according to the first embodiment, wherein the corrugated stiffener has principal axes of corrugation, and wherein the concentrating solar mirror panel assembly has an axis of curvature that is substantially parallel to the principal axes of corrugation.

In a third embodiment, the present disclosure provides the concentrating solar mirror panel assembly according to the first or second embodiment, wherein the locking sheet is coextensive with the corrugated stiffener.

In a fourth embodiment, the present disclosure provides the concentrating solar mirror panel assembly according to any preceding embodiment, wherein the locking sheet is a corrugated sheet having principal axes of corrugation, wherein the concentrating solar mirror panel assembly has an axis of curvature that is substantially perpendicular to the principal axes of corrugation of the locking sheet.

In a fifth embodiment, the present disclosure provides the concentrating solar mirror panel assembly according to any preceding embodiment, wherein an acute angle between the reflective sheet and a side of a ridge of the corrugated stiffener is in a range from 40 to 89 degrees.

In a sixth embodiment, the present disclosure provides the concentrating solar mirror panel assembly according to the fifth embodiment, wherein the acute angle between the reflective sheet and the side of the ridge is in a range from 60 to 80 degrees.

In a seventh embodiment, the present disclosure provides a concentrating solar mirror panel assembly comprising:

a reflective sheet having a reflective major surface and an opposing major surface; and a corrugated stiffener having principal axes of corrugation and having ridges and troughs each having an outer surface with land areas, wherein the land areas of at least a portion of the ridges are joined to at least a portion of the opposing major surface of the reflective sheet;

wherein the concentrating solar mirror panel assembly is non-planar and substantially rigid and has an axis of curvature that is substantially perpendicular to the principal axes of corrugation of the corrugated stiffener.

In an eighth embodiment, the present disclosure provides the concentrating solar mirror panel assembly according to any preceding embodiment, wherein at least a portion of the ridges or the troughs is provided with perforations.

In a ninth embodiment, the present disclosure provides the concentrating solar mirror panel assembly according to any preceding embodiment, wherein the corrugated stiffener is coextensive with the reflective sheet.

In a tenth embodiment, the present disclosure provides the concentrating solar mirror panel assembly according to any preceding embodiment, wherein the land areas of at least a portion of the ridges are joined to at least a portion of the opposing major surface of the reflective sheet with an adhesive.

In an eleventh embodiment, the present disclosure provides the concentrating solar mirror panel assembly according to the tenth embodiment, wherein the adhesive is a pressure sensitive adhesive.

In a twelfth embodiment, the present disclosure provides the concentrating solar mirror panel assembly according to the tenth embodiment, wherein the adhesive is a structural adhesive.

In a thirteenth embodiment, the present disclosure provides the concentrating solar mirror panel assembly according to any preceding embodiment, wherein the reflective sheet comprises a solar reflecting film laminate.

In a fourteenth embodiment, the present disclosure provides the concentrating solar mirror panel assembly according to any one of the first to twelfth embodiments, wherein the reflective sheet comprises at least one of a glass sheet or metallic sheet.

In a fifteenth embodiment, the present disclosure provides the concentrating solar mirror panel assembly according to the fourteenth embodiment, wherein the glass sheet has a thickness of up to two millimeters.

In a sixteenth embodiment, the present disclosure provides the concentrating solar mirror panel assembly according to any preceding embodiment, wherein the concentrating solar mirror panel assembly is parabolic.

In a seventeenth embodiment, the present disclosure provides the concentrating solar mirror panel assembly according to any preceding embodiment, wherein at least one of the locking sheet or the corrugated stiffener comprises metal or a polymer composite.

In an eighteenth embodiment, the present disclosure provides the concentrating solar mirror panel assembly according to any preceding embodiment, wherein at least one of the corrugated stiffener or the locking sheet comprises aluminum.

In a nineteenth embodiment, the present disclosure provides the concentrating solar mirror panel assembly according to any preceding embodiment, wherein the corrugated stiffener is not capable of being extruded.

In a twentieth embodiment, the present disclosure provides the concentrating solar mirror panel assembly according to any preceding embodiment, wherein the concentrating solar mirror panel assembly has a natural frequency of at least 30 Hz, as measured by finite element analysis simulation.

In a twenty-first embodiment, the present disclosure provides the concentrating solar mirror panel assembly according to any preceding embodiment, wherein the concentrating solar mirror panel assembly has a dimension of at least 10 feet, and wherein the reflective sheet and the corrugated stiffener are each unitary pieces.

In a twenty-second embodiment, the present disclosure provides the concentrating solar mirror panel assembly according to any preceding embodiment, wherein a length of the land area is at least 5 times a thickness of the corrugated stiffener.

In a twenty-third embodiment, the present disclosure provides the concentrating solar mirror panel assembly according to any preceding embodiment, further comprising endcaps at least partially enveloping at least two opposing edges of the concentrating solar mirror panel assembly.

In a twenty-fourth embodiment, the present disclosure provides a concentrated solar power system comprising:

at least one concentrating solar mirror panel assembly according to any preceding embodiment capable of being aligned to direct solar radiation onto a hollow receiver; and a heat transfer fluid at least partially disposed within the hollow receiver.

In a twenty-fifth embodiment, the present disclosure provides a solar collection device comprising:

a photovoltaic cell; and a concentrating solar mirror panel assembly according to any one of the first to twenty-third embodiments capable of being aligned to direct solar radiation onto the photovoltaic cell.

In a twenty-sixth embodiment, the present disclosure provides a method of making the concentrating solar mirror panel assembly according to any one of the first to sixth embodiments, the method comprising:

providing the reflective sheet having the reflective major surface and the opposing major surface;

attaching the corrugated stiffener to at least a portion of the opposing major surface of the reflective sheet, the corrugated stiffener comprising ridges and troughs each having an outer surface with land areas, wherein the land areas of at least a portion of the ridges are attached to the opposing major surface of the reflective sheet;

attaching the locking sheet to the land areas of at least a portion of the troughs.

In a twenty-seventh embodiment, the present disclosure provides a method of making the concentrating solar mirror panel assembly according the seventh or eighth embodiment, the method comprising:

providing the reflective sheet having the reflective major surface and the opposing major surface;

attaching the corrugated stiffener to at least a portion of the opposing major surface of the reflective sheet, the corrugated stiffener comprising ridges and troughs each having an outer surface with land areas, wherein the land areas of at least a portion of the ridges are attached to the opposing major surface of the reflective sheet such that the principal axes of corrugation of the corrugated stiffener are substantially perpendicular to the axis of curvature of the reflective sheet.

In a twenty-eighth embodiment, the present disclosure provides the method according to the twenty-seventh embodiment, further comprising attaching a locking sheet to the land areas of at least a portion of the troughs.

In a twenty-ninth embodiment, the present disclosure provides the method according to any one of the twenty-sixth to twenty-eighth embodiments, further comprising forming the reflective sheet into a predetermined shape before attaching the corrugated stiffener to at least a portion of the opposing major surface of the reflective sheet.

In a thirtieth embodiment, the present disclosure provides the method according to any one of the twenty-sixth to twenty-ninth embodiments, further comprising:

selecting a geographical location for the concentrating solar mirror panel assembly, the geographical location having an average wind speed;

receiving data comprising the average wind speed and a target weight of the concentrating solar mirror panel assembly; and generating a design for the concentrating solar mirror panel assembly, the design comprising a material composition and thicknesses of the reflective sheet, the corrugated stiffener, and optionally the locking sheet; a height between a top of the ridges and a bottom of the troughs; and an acute angle between the reflective sheet and a side of a ridge of the corrugated stiffener, wherein the design is based at least partially on information concerning strength and stiffness of the concentrating solar mirror panel assembly when exposed to the average wind speed.

Objects and advantages of this disclosure are further illustrated by the following non-limiting examples, but the particular materials and amounts thereof recited in these examples, as well as other conditions and details, should not be construed to unduly limit this disclosure.

EXAMPLES

Modeling Method and Examples 1-17

The analysis package "ABAQUS V6.9" commercially available from Simulia (Providence, R.I.) and the Finite Element Method (FEM) was used to analyze all the reflector variants as detailed in Table 1. A full 3D mechanical simulation was used with 3D shell elements. All polymer mirrors were considered to be 47 inches (120 cm) in the down-parabolic direction and 124 inches (315 cm) along the parabolic curve. Two glass mirrors were used to span the 124-inch (315-cm) arc length, which is standard practice in the industry. The boundary conditions utilized for the analysis included static connections of the mirror systems to four frame stringers. The arc length locations of the stringers were defined from the bottom of the mirror along the parabolic as follows: 13 inches (33 cm), 54.5 inches (138 cm), 77.5 inches (197 cm) and 112 inches (285 cm). The parabolic equation of $Y=(X^2/(4\times F))$ was used, where F is the focus and is 1710 mm.

The glass mirrors used standard ceramic mounting pads while their sheet metal analogs used hold down bars across the back structure. Wind loading was simulated using static pressures defined by the Uniform Building Code. These pressures were defined in the incident wind direction. The 156, 130, and 90 mph (250, 209, and 125 kph) wind loads were applied to a mirror considered in the stowed position, or a receiver tube position of −30 degrees to the horizon. The following pressures correspond to the associated wind velocities; 156 mph=92.5 pounds per square foot (psf) (250 kph=4430 Pa), 130 mph=64.2 psf (209 kph=3070 Pa), and 90 mph=30.8 psf (125 kph=1475 Pa). These loadings do not account for wind debris such as grit and structural lumber that may be picked up in these extreme velocities. The 50 mph (80.5 kph) wind loading (9.5 psf, 455 Pa) was defined in the active collection mode with the wind direction flowing perpendicular to the mirror system representing a worst case scenario. The accuracy was defined by reflecting the incident solar vector about the deformed element normal and calculating if it encounters the 2.75-inch (70 mm) receiver tube. This calculation was performed on all the reflector surface's elements using a custom Python script with the "ABAQUS" backbone architecture. The calculation does not account for refraction of the light through the film or glass. Examples 1 to 14 were considered to be manufactured of 3003-H16 Aluminum, and Examples 15-17 were 5052-H38 aluminum. The 3003-H16 was modeled using a non-linear elastic-plastic material model which incorporated an elastic modulus of 10 million pounds per square inch (msi) ($6.9\times10^{10}$ Pa), a yield of 27 thousand pounds per square inch (ksi) ($1.9\times10^8$ Pa), and an ultimate strength of 29 ksi ($2.0\times10^8$ Pa). The 5052-H38 was modeled using a non-linear elastic-plastic material model which incorporated an elastic modulus of 10.2 msi ($7.0\times10^{10}$ Pa), a yield of 38 ksi ($2.6\times10^8$ Pa), and an ultimate strength of 42 ksi ($2.9\times10^8$ Pa). The Soda Lime Glass was modeled using a purely elastic model due to its brittle nature. The glass modulus was 10 msi ($6.9\times10^{10}$ Pa) with an ultimate strength of 10 ksi ($6.9\times10^7$ Pa) and no yielding. The modeling effort assumed perfect bonding between the three components in the assembly. Table 1 details the examples using the modeling method. The "total thickness" value accounts for the thickness of all the components in the Examples or the substrate and mounting pads in the Comparative Example (CE). The total thickness includes the height of the corrugation, which height can be determined by subtracting the "material thickness" described below from the total thickness. The height of the corrugation refers to the distance between the top of the ridges to the bottom of the troughs. The "angle" parameter refers to the acute angle in degrees (deg.) between the reflective sheet and a side of the ridge of the corrugation. "Land length" refers to the length of the land portion of corrugation, which in Examples 1-8 and 10-13 is substantially flat. "Mass per reflector area" in pound mass per square foot (lbm/ft$^2$) is a purely volumetric calculation excluding adhesive mass. "Material thickness" has three values for most of the variants and these are listed in Table 1 in the following respective order: "substrate" which refers to the reflecting sheet, "core" which refers to the corrugated stiffener, and "locking" which refers to the locking sheet. The comparative example 1 glass design has no locking or core sheets and strictly relies on a 0.157-inch (in.) (4-mm) glass sheet for stiffness. Example 14 assumed an epoxy bond line of 0.015 inches (0.38 mm) creating a land length of 0.25 inches (6.4 mm). Examples 15-17 assumed a maximum adhesive thickness of 0.020 inches (0.51 mm) for rounded land areas of a sinusoidal-shaped corrugated stiffener. Examples 14-17 demonstrate the embodiment with no locking sheet and principal axes of corrugation substantially perpendicular to the axis of curvature of the parabola. In Example 8, three 6-inch (15 cm) wide strips that were each 124 inches (315 cm) along the parabolic curve were used as locking sheet portions. The strips in Example 8 were spaced as shown in FIGS. 1a and 1b, with one strip centrally placed and the other two placed at the ends. In Examples 1-7 and 9-13, the reflective sheet, corrugated stiffener, and locking sheet were coextensive. In Examples 14-17, the reflective sheet and corrugated stiffener were coextensive. In Table 1, NA means not applicable.

Example 18

A 28-inch (71 cm) by 1-foot (30.5 cm) aluminum sheet of about 0.025 inch (0.635 mm) thickness was laminated with a reflective mirror film to produce a reflective sheet with a reflective surface and a back surface. The reflective sheet was placed with reflective surface down, onto the curved surface of a forming jig. The profile of the jig was designed to account for any spring-back of the final assembly, so that the final shape of the mirror would have a profile of the desired shape. VHB tape known under the trade designation "VHB TAPE 4920" commercially available from 3M Company, St. Paul, Minn. was applied to the top and bottom flat sections of the corrugated sheet. The corrugated sheet was then placed over the reflective sheet, so that the flat sections of the corrugation contacted the back surface of the reflective sheet. A back sheet was then placed over the corrugated sheet so that the top flat ridges of the corrugated sheet contacted the back sheet evenly across all surfaces. Weights (light sand filled bags) were placed evenly across the back surface of the back-sheet in order to hold the assembly to the curved profile of the jig until the tape was set. The weights were removed and the mirror assembly removed from the jig.

Example 19

This example was done identically to example 18 except that the VHB tape was replaced with an epoxy adhesive known under the trade designation "SCOTCHWELD DP420" commercially available from 3M Co., St. Paul, Minn.

Example 20

This example was done identically to example 18 except that an end-cap profile (see end-cap 18 in FIG. 1b) was also used to secure the alignment of the reflective sheet with respect to the back-sheet. The end-caps were made from 0.063-inch (1.6-mm) thick 3003-H13 aluminum. These end-caps were adhered with "SCOTCHWELD DP420". Spacer wires that were 0.010 inches (0.25 mm) thick were used on each side and end of the assembly to form the adhesive bondlines.

Figure 3:
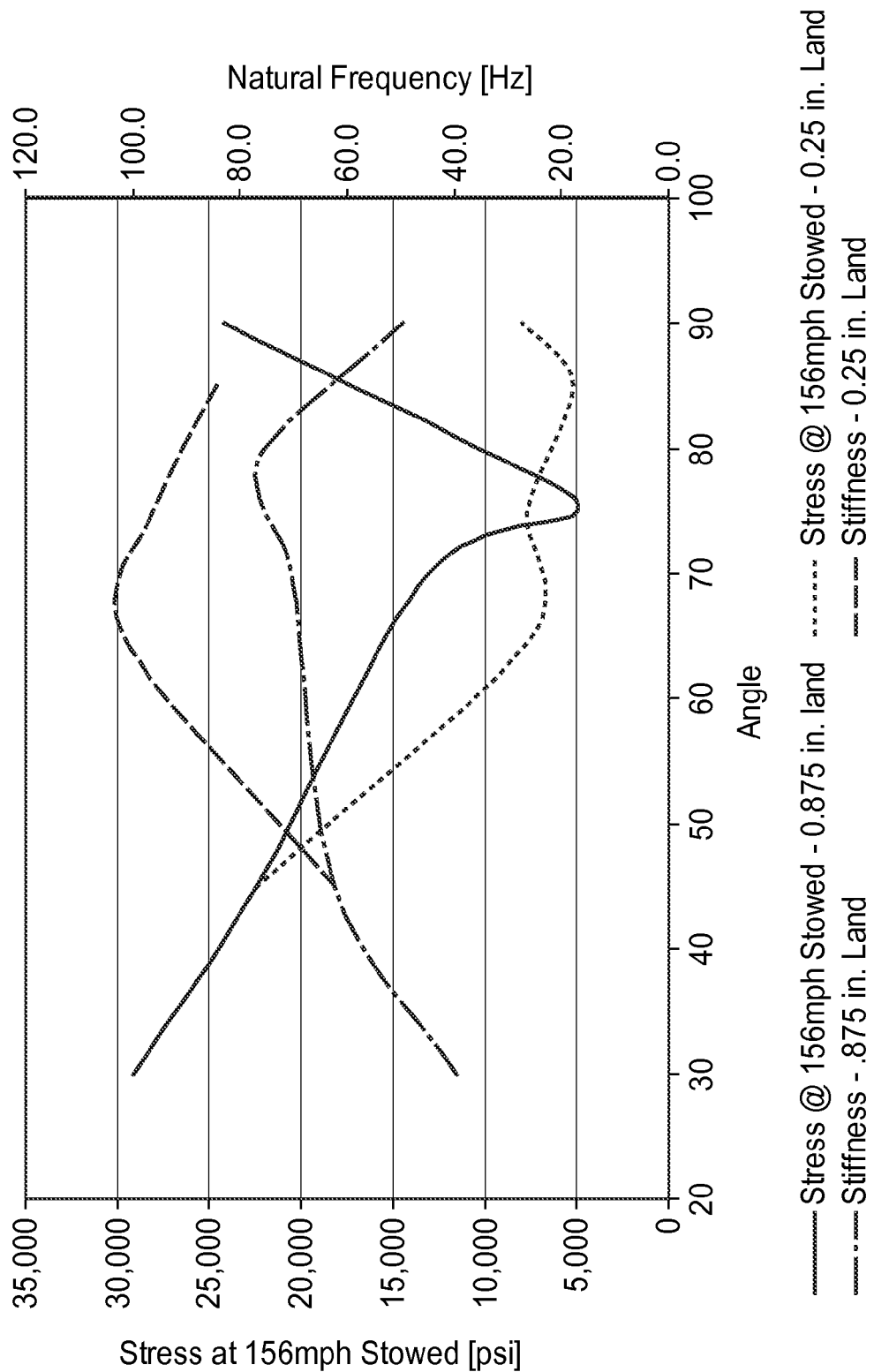
FIG. 3 is a graph showing the stress and stiffness versus corrugation angle for the concentrating solar mirror panel assemblies of Examples 1, 3, 4, 5, 7, and 10-13.

The stress in psi at 156 mph (250 kph) and stiffness are plotted versus angle for Examples 3, 4, 5, and 7 for one set of curves and Examples 1 and 10-13 for the other set of curves shown in FIG. 3.

TABLE 1

| | Total thickness (in., cm) | Angle (deg.) | Land length (in., mm) | Mass/area (lbm/ft², kg/m²) | Material thickness (in., mm) substrate/core/locking | Stress (psi) @156 mph @90 mph @50 mph | Reflector Accuracy @ 50 mph (%) | Nat. Freq. (Hz) |
|---|---|---|---|---|---|---|---|---|
| CE1 | 0.50, 1.3 | NA | NA | 2.30, 11 | 0.157, 4<br>0.00<br>0.00 | 43,340<br>30,280<br>14,050 | 81 | 19.3 |
| EX1 | 0.50, 1.3 | 45 | 0.25, 6.4 | 0.86, 4.2 | 0.020, 0.51<br>0.016, 0.41<br>0.020, 0.51 | 9,711<br>6,893<br>3,401 | 100 | 62.5 |
| EX2 | 0.50, 1.3 | 45 | 0.25, 6.4 | 0.75, 3.7 | 0.016, 0.41<br>0.010, 0.25<br>0.016, 0.41 | 16,260<br>10,555<br>5,473 | 100 | 59.5 |
| EX3 | 0.60, 1.5 | 54 | 0.875, 22 | 0.85, 4.2 | 0.020, 0.51<br>0.016, 0.41<br>0.020, 0.51 | 22,420<br>14,560<br>6,595 | 100 | 62.3 |
| EX4 | 0.60, 1.5 | 30 | 0.875, 22 | 0.81, 4.0 | 0.020, 0.51<br>0.016, 0.41<br>0.020, 0.51 | 29,140<br>28,760<br>27,540 | 96 | 39.6 |
| EX5 | 0.60, 1.5 | 75 | 0.875, 22 | 0.89, 4.3 | 0.020, 0.51<br>0.016, 0.41<br>0.020, 0.51 | 4,967<br>3,461<br>1,668 | 100 | 75.5 |
| EX6 | 0.58, 1.5 | 75 | 0.875, 22 | 0.49, 2.4 | 0.010, 0.25<br>0.010, 0.25<br>0.010, 0.25 | 8,267<br>5,732<br>2,746 | 100 | 74.3 |
| EX7 | 0.60, 1.5 | 90 | 0.875, 22 | 0.94, 4.6 | 0.020, 0.51<br>0.016, 0.41<br>0.020, 0.51 | 24,190<br>16,665<br>7,955 | 100 | 49.9 |
| EX8 | 0.60, 1.5 | 54 | 0.875, 22 | 0.67, 3.3 | 0.020, 0.51<br>0.016, 0.41<br>0.020, 0.51 | 29,260<br>28,670<br>26,910 | 92 | 35.8 |
| EX9 | 0.50, 1.3 | 45 | 0 | 0.89, 4.3 | 0.020, 0.51<br>0.016, 0.41<br>0.020, 0.51 | 6,441<br>4,472<br>2,146 | 100 | 93.9 |

TABLE 1-continued

| | Total thickness (in., cm) | Angle (deg.) | Land length (in., mm) | Mass/ area (lbm/ft², kg/m²) | Material thickness (in., mm) substrate/ core/locking | Stress (psi) @156 mph @90 mph @50 mph | Reflector Accuracy @ 50 mph (%) | Nat. Freq. (Hz) |
|---|---|---|---|---|---|---|---|---|
| EX10 | 0.60, 1.5 | 65 | 0.25, 6.4 | 0.95, 4.6 | 0.020, 0.51<br>0.016, 0.41<br>0.020, 0.51 | 7467<br>5180<br>2483 | 100 | 102 |
| EX11 | 0.60, 1.5 | 75 | 0.25, 6.4 | 1.04, 5.1 | 0.020, 0.51<br>0.016, 0.41<br>0.020, 0.51 | 7712<br>5354<br>2569 | 100 | 96.2 |
| EX12 | 0.60, 1.5 | 85 | 0.25, 6.4 | 1.19, 5.8 | 0.020, 0.51<br>0.016, 0.41<br>0.020, 0.51 | 5231<br>3645<br>1757 | 100 | 84.5 |
| EX13 | 0.60, 1.5 | 90 | 0.25, 6.4 | 1.31, 6.4 | 0.020, 0.51<br>0.016, 0.41<br>0.020, 0.51 | 7927<br>5499<br>2636 | 100 | 60.3 |
| EX14 | 0.54, 1.4 | 45 | 0.25, 6.4 | 0.59, 2.9 | 0.020, 0.51<br>0.020, 0.51<br>No locking | 27,360<br>18,935<br>9,061 | 100 | 86.3 |
| EX15 | 0.54, 1.4 | 26 | 0.28, 7.1 | 0.586, 2.9 | 0.020, 0.51<br>0.020, 0.51<br>No locking | 27360<br>18935<br>9061 | 100 | 86.3 |
| EX16 | 0.54, 1.4 | 45 | 0.17, 4.3 | 0.656, 3.2 | 0.020, 0.51<br>0.020, 0.51<br>No locking | 29420<br>20405<br>9780 | 100 | 93.1 |
| EX17 | 0.54, 1.4 | 75 | 0.09, 2.3 | 1.027, 5.0 | 0.020, 0.51<br>0.020, 0.51<br>No locking | 31270<br>21680<br>10390 | 100 | 96.5 |

All patents and publications referred to herein are hereby incorporated by reference in their entirety. Various modifications and alterations of this disclosure may be made by those skilled in the art without departing from the scope and spirit of this disclosure, and it should be understood that this disclosure is not to be unduly limited to the illustrative embodiments set forth herein.

What is claimed is:

1. A concentrating solar mirror panel assembly comprising:
    a reflective sheet having a reflective major surface and an opposing major surface; and
    a corrugated stiffener having principal axes of corrugation and having ridges and troughs each having an outer surface with land areas, wherein the land areas of at least a portion of the ridges are joined to at least a portion of the opposing major surface of the reflective sheet;
    wherein the concentrating solar mirror panel assembly does not include a locking sheet joined to at least a portion of the land areas of the troughs of the corrugated stiffener and is non-planar and substantially rigid on its own, without requiring a supporting frame to hold it substantially rigid, and wherein the concentrating solar mirror panel assembly has an axis of curvature that is substantially perpendicular to the principal axes of corrugation of the corrugated stiffener.

2. The concentrating solar mirror panel assembly according to claim 1, wherein at least a portion of the ridges or the troughs is provided with perforations.

3. The concentrating solar mirror panel assembly according to claim 1, wherein the land areas of at least a portion of the ridges are joined to at least a portion of the opposing major surface of the reflective sheet with an adhesive.

4. The concentrating solar mirror panel assembly according to claim 1, wherein the concentrating solar mirror panel assembly has a natural frequency of at least 30 Hz, as measured by finite element analysis simulation.

5. The concentrating solar mirror panel assembly according to claim 1, wherein a length of the land area is at least 5 times a thickness of the corrugated stiffener.

6. The concentrating solar mirror panel assembly according to claim 1, further comprising end-caps at least partially enveloping at least two opposing edges of the concentrating solar mirror panel assembly.

7. A concentrated solar power system comprising:
    at least one concentrating solar mirror panel assembly according to claim 1 capable of being aligned to direct solar radiation onto a hollow receiver; and
    a heat transfer fluid at least partially disposed within the hollow receiver.

8. A solar collection device comprising:
    a photovoltaic cell; and
    a concentrating solar mirror panel assembly according to claim 1 capable of being aligned to direct solar radiation onto the photovoltaic cell.

9. A method of making the concentrating solar mirror panel assembly according to claim 1, the method comprising:
    providing the reflective sheet having the reflective major surface and the opposing major surface;
    attaching the corrugated stiffener to at least a portion of the opposing major surface of the reflective sheet, the corrugated stiffener comprising ridges and troughs each having an outer surface with land areas, wherein the land areas of at least a portion of the ridges are attached to the opposing major surface of the reflective sheet such that the principal axes of corrugation of the corrugated stiffener are substantially perpendicular to the axis of curvature of the reflective sheet.

10. The concentrating solar mirror panel assembly according to claim 1, wherein the reflective sheet comprises a solar reflecting film laminate.

11. The concentrating solar mirror panel assembly according to claim 1, wherein the concentrating solar mirror panel assembly is parabolic, with a radius of curvature of up to 10 meters.

12. The concentrating solar mirror panel assembly according to claim 1, wherein the concentrating solar mirror panel assembly has a dimension of at least 10 feet, and wherein the reflective sheet and the corrugated stiffener are each unitary pieces.

13. The method of claim 9, further comprising forming the reflective sheet into a predetermined shape before attaching the corrugated stiffener to at least a portion of the opposing major surface of the reflective sheet.

* * * * *